United States Patent [19]

Frederick et al.

[11] Patent Number: 5,680,046
[45] Date of Patent: Oct. 21, 1997

[54] DOUBLE-SIDED RF SHIELD FOR RF COIL CONTAINED WITHIN GRADIENT COILS USED IN HIGH SPEED NMR IMAGING

[75] Inventors: Perry Scott Frederick, Waukesha; Walter Albert Zimmermann, Milwaukee, both of Wis.; Peter Bernard Roemer, Schenectady, N.Y.

[73] Assignee: General Electric Company, Milwaukee, Wis.

[21] Appl. No.: 286,366

[22] Filed: Aug. 5, 1994

[51] Int. Cl.$^6$ .................................................. G01Y 3/00
[52] U.S. Cl. .................... 324/318; 324/322; 128/653.5
[58] Field of Search ............................ 324/318, 322, 324/314, 307, 309; 128/653.5

[56] References Cited

U.S. PATENT DOCUMENTS

| | | | |
|---|---|---|---|
| 4,506,224 | 3/1985 | Krause | 324/319 |
| 4,642,569 | 2/1987 | Hayes et al. | 324/318 |
| 4,879,515 | 11/1989 | Roemer et al. | 324/318 |
| 5,243,286 | 9/1993 | Rzedzian et al. | 324/318 |
| 5,367,261 | 11/1994 | Frederick | 324/318 |

*Primary Examiner*—Louis M. Arana
*Attorney, Agent, or Firm*—Quarles & Brady

[57] ABSTRACT

A magnetic resonance system includes a cylindrical shield disposed between a quadrature RF coil and surrounding gradient coils. The shield includes a pair of copper sheets separated by an insulating dielectric sheet. A pattern formed by cuts in one copper sheet aligns with the currents induced in the shield by one of the RF quadrature fields, and a pattern formed by cuts in the other copper shield aligns with the other RF quadrature field. The copper sheets are shorted together to prevent voltage breakdowns and short cuts are made in each to prevent gradient induced eddy currents.

6 Claims, 3 Drawing Sheets

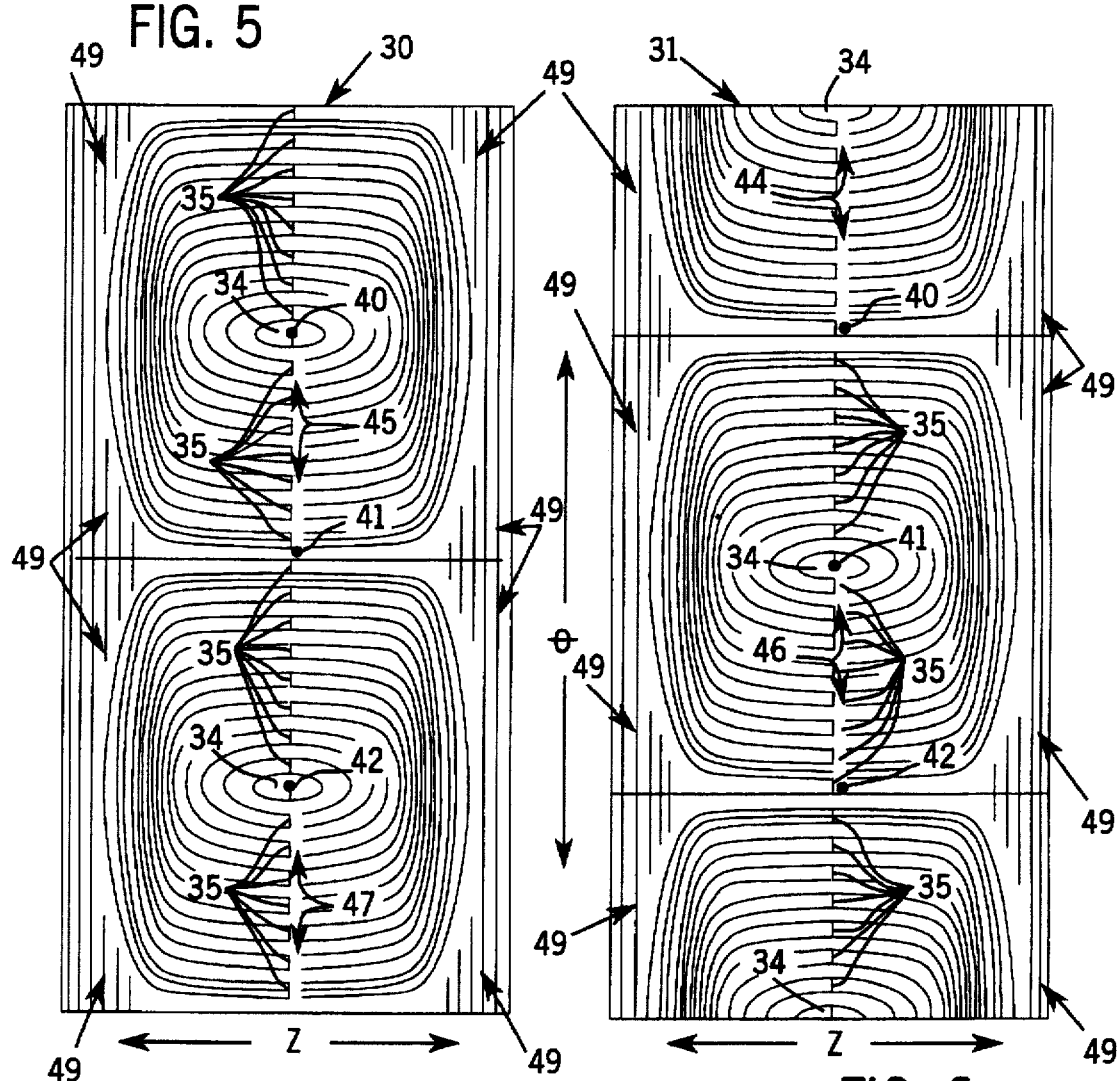
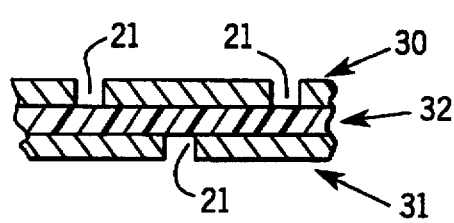

DOUBLE-SIDED RF SHIELD FOR RF COIL CONTAINED WITHIN GRADIENT COILS USED IN HIGH SPEED NMR IMAGING

BACKGROUND OF THE INVENTION

The present invention relates to radio-frequency (RF) shields and, more particularly, to a novel double-sided RF shield for placement between an RF body coil and a set of gradient coils in a nuclear-magnetic resonance (NMR) imaging device.

An NMR imaging device typically utilizes a set of three gradient coils to obtain spatially-selective information. Each of these gradient coils generally contain a multiplicity of turns of conductive wire, with total lengths of up to several hundred meters. RF fields lose a significant portion of their energy if these fields impinge upon the conductive wires of the gradient coils; while the loss mechanism is not fully understood, it is probably associated with high current resonances exciting the gradient structure and producing associated high losses. Any RF power loss, in the gradient coils or otherwise, appears as a lowering of the quality factor Q of the RF coil and consequently appears as a lowering of the signal-to-noise ratio (SNR) attainable in the imaging device. Accordingly, it is highly desirable to prevent penetration of the RF field into the surrounding gradient coils and a shield is typically placed between the RF coil and the gradient coils to accomplish this. The RF shield must, however, be substantially transparent to the gradient magnetic fields and therefore must prevent inducement of any significant shield currents at gradient frequencies (typically less than about 10 KHz) to prevent temporally-dependent and/or spatially-dependent magnetic field inhomogeneities from appearing and having an adverse affect on the resulting image.

Hitherto, the most commonly used RF shield has been a double-sided shield using a copper-dielectric-copper laminate sheet. The pattern of the conductive paths in each copper sheet is generally an approximation of the current paths induced in a solid shield due to the field produced by the RF coil. One such structure is disclosed in U.S. Pat. No. 4,879,515, which issued on Nov. 7, 1989 and is entitled "Double-Sided RF Shield For RF Coil Contained Within Gradient Coils Of NMR Imaging Device".

To prevent the flow of eddy currents in the copper sheets due to the gradient magnetic field pulses, the conductive patterns are cut, or open-circuited, such that no closed loops are formed. However, because the copper patterns are identical on both sides of the dielectric layer (except for the placement of the cuts) they form a capacitor which offers a very low impedance at the Larmor frequency of the RF coil. This capacitance effectively short circuits the cuts and maintains the integrity of the shield at RF frequencies.

High speed imaging ("HSI") and echo planar imaging ("EPI") employ very high speed gradient pulses with slew rates up to 230 T/m/s. The standard gradient coils, gradient amplifiers, RF coils and shielding components on a whole body MR imaging system have had limited success in performing these protocols. The primary reason is the undesirable reactions between the RF shield and the gradient amplifiers, leading to gradient amplifier instability or saturation as well as RF shield heating. The transitional environment between the RF coil and the gradient coils must be improved if such protocols are to be used.

Another challenge to the design of a successful RF shield is its cost. The RF coils used in state-of-the-art MR imaging systems produce two RF fields oriented 90° from each other as measured in a plane perpendicular to the direction of the polarizing field. As a result, prior systems using such quadrature fields employ two separate shields (i.e. copper sheet-dielectric-copper sheet) with their conductive patterns separately aligned to coincide with the respective quadrature fields produced by the RF coil. The use of two such shields is costly.

SUMMARY OF THE INVENTION

The present invention is an RF shield for a quadrature RF field coil which does not significantly alter the performance of the gradient field subsystem or the performance of the RF coil. More specifically, the invention includes a dielectric sheet disposed around the quadrature RF field coil, a first copper sheet mounted on one surface of the dielectric sheet and having conductive paths formed therein which coincide with the currents induced by one of the fields produced by the quadrature RF field coil, and a second copper sheet mounted on the other surface of the dielectric sheet and having conductive paths formed therein which coincide with the currents induced by the other of the fields produced by the quadrature RF field coil, wherein the conductive paths formed in said first and second copper sheets include a plurality of closed loops, and cuts are made to open circuit each of these closed loops.

A general object of the invention is to provide a shield for a quadrature RF coil. It has been discovered that a single copper-dielectric-copper shield can be used for a quadrature coil by shifting the conductive patterns 90° with respect to each other so that each coincides with one of the quadrature RF fields. Since the conductors on both sides of the dielectric sheet no longer align with each other, the capacitance needed to short circuit the cuts in the closed loops is reduced. This is offset by reducing the thickness of the dielectric sheet, and by staggering the cuts to maintain balance between the performance (i.e. Q) of each quadrature coil mode.

A more specific object of the invention is to prevent voltage breakdown events from occurring between the two copper sheets and between adjacent conductive paths on the same copper sheet. This is accomplished by short circuiting the two copper sheets at a plurality of locations around the circumference of the shield and by providing a short circuit path in the copper sheets between these locations to form a conductive ring around the circumference of the shield. The conductive ring insures that gradient induced voltages between sheets and between adjacent conductive paths in each sheet does not reach a level which can cause a breakdown through or across the dielectric material.

BRIEF DESCRIPTION OF THE DRAWINGS

FIG. 5 is a plan view of the conductive paths formed on one copper sheet of the present invention to shield the one quadrature field;

FIG. 6 is a plan view of the conductive paths formed on the other copper sheet of the present invention to shield the other quadrature field;

FIG. 8 is a partial view in cross section through the shield of the present invention made using the copper sheets of FIGS. 5 and 6.

DESCRIPTION OF THE PREFERRED EMBODIMENT

Figure 1:
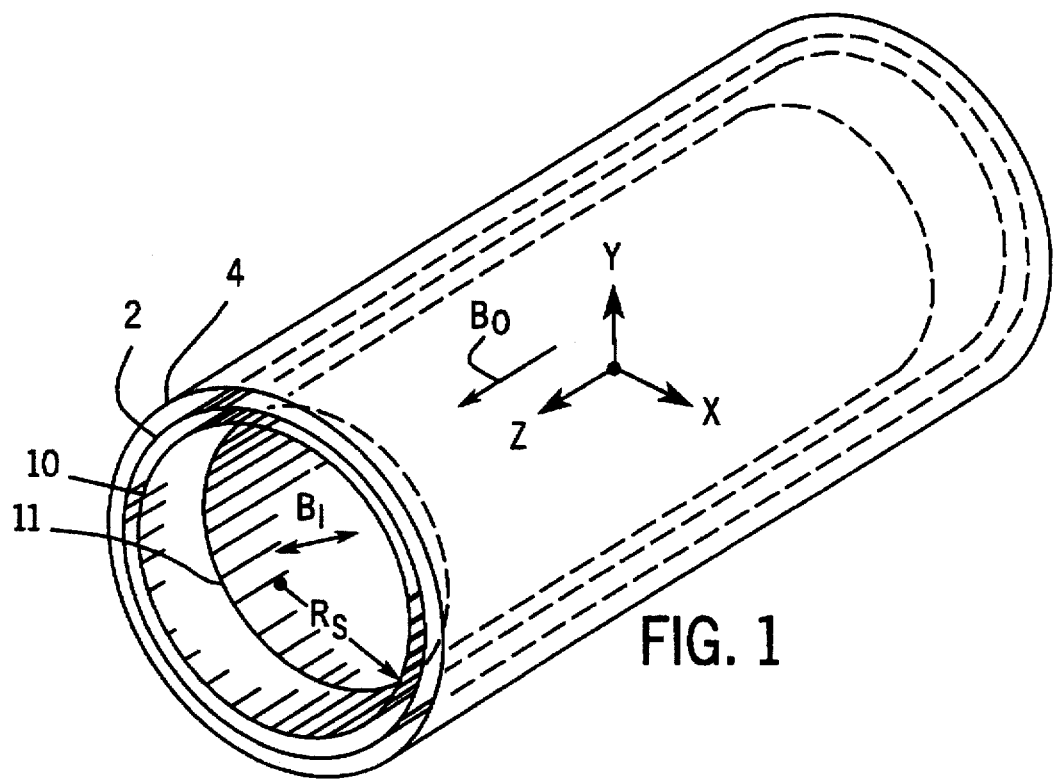
FIG. 1 is a perspective view of an RF whole body coil, RF shield and gradient coil assembly for an MR imaging system.

Referring initially to FIG. 1, a radio-frequency (RF) shield 10, in accordance with the present invention, is a hollow cylindrical conductive member situated between a RF whole body coil 11 and a set of magnetic field gradient coils 2, within the bore 4 of a magnet (not shown) in a nuclear magnetic resonance (NMR) imaging device. By convention, the static main magnetic field $B_0$ of the main NMR system magnet (produced by the magnetic means formed about bore 4) is aligned with the z axis of a Cartesian coordinate system. The RF coil 11 forms an RF magnetic field $B_1$ within the coil 11 bore responsive to a RF signal. Field $B_1$ is typically in the X-Y plane. A significant RF magnetic field is also present outside of coil 11, and, as is well known in the art, will impinge upon gradient coils 2 unless the RF shield 10 is present and effectively operates as an RF short circuit. Shield 10 must be substantially transparent to the magnetic fields from gradient coils 2, allowing those gradient magnetic fields to enter into the bore of RF coil 11 and place spatial-encoding information upon the volume therein.

Figure 2:
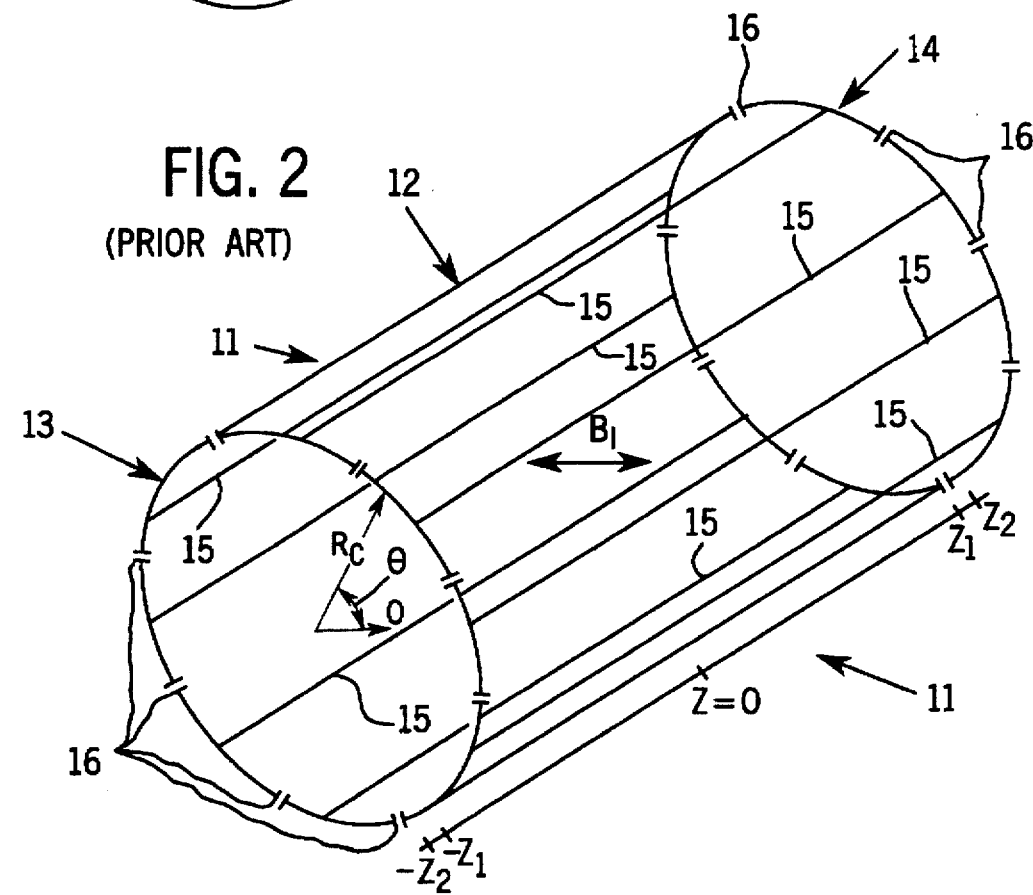
FIG. 2 is a schematic perspective view of a prior art quadrature RF coil.
Figure 3:
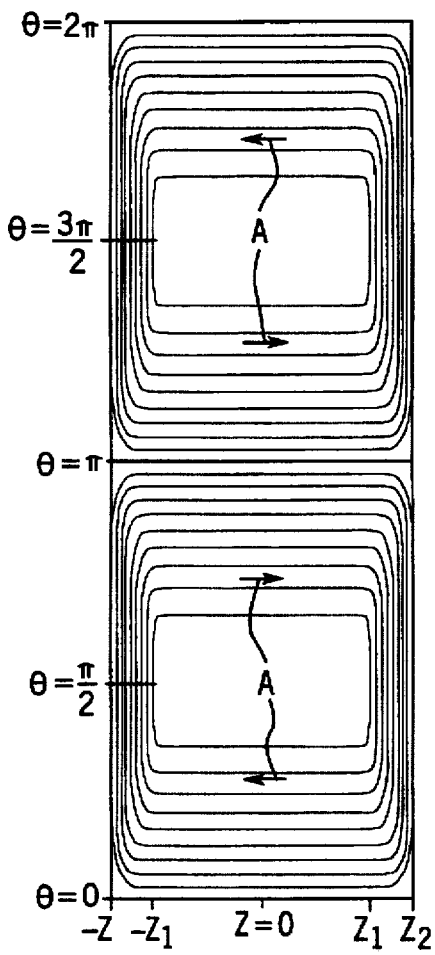
FIG. 3 is a graphic illustration of the current distribution contours of one of the quadrature fields produced by the prior art coil of FIG. 2.

A typical whole body RF coil 11 is shown in FIG. 2 this high-pass "birdcage" coil, formed upon a cylindrical base 12 of insulative material, comprises first and second spaced-apart end rings 13 and 14, each having a plurality of conductive segments (here 8 segments) joined to one another by capacitive elements 16. Each of the end rings 13 and 14 is thus substantially in the X-Y plane, as is the $B_1$ RF field produced. A like number of axial conductors 15 extend in the z direction between one of the conductive segments of first end ring 13 and a like-positioned conductive segment of the second conductive end ring 14. Thus, a first elongated conductive element 15 is positioned at an angle θ=0 and each of the remaining seven elongated conductive members 15 are placed at successively greater angles around the periphery. Because of the cylindrical symmetry of the coil, the RF magnetic fields and currents are analyzed utilizing cylindrical coordinates, of the form R, θ, where θ is the angle of revolution with respect to that plane formed through the z axis and one of the conductive members 15. The axial center of coil 11 is placed at the z=0 coordinate, and it is assumed that the birdcage coil currents are confined to a very thin layer and tend to flow through the areas of the end rings, defined by inner end ring dimension $z_1$ and outer end ring dimension $z_2$. The assumed coil distribution contours, parallel to the lines of current flow, are shown in FIG. 3, for an unwrapped coil laid flat and having a single excited mode. The separations between contours are equally spaced in current, and the current flow is in the direction of arrows A.

Figure 4:
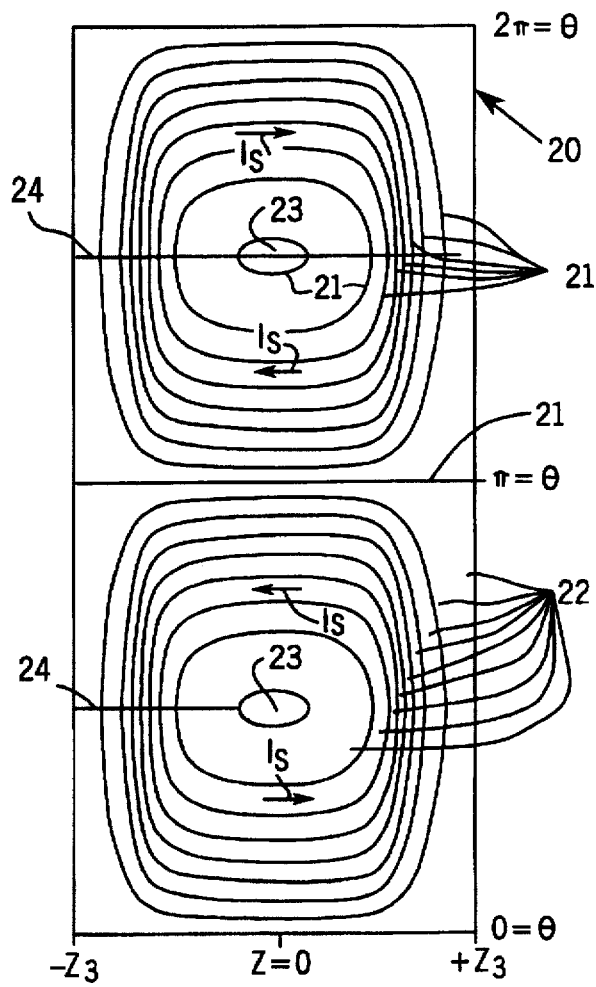
FIG. 4 is a graphical illustration of the currents flowing in an RF shield surrounding the prior art RF coil of FIG. 2 as a result of one of its quadrature fields.

As explained in U.S. Pat. No. 4,879,515 issued on Nov. 7, 1989 and entitled "Double-Sided RF Shield For RF Coil Contained Within Gradient Coils Of NMR Imaging Device", a shield for the field producing the current contours of FIG. 3 is shown in FIG. 4. The disclosure of this patent is hereby incorporated by reference and teaches that a sheet of copper 20 is cut as indicated by contour lines 21 to form separate conductive paths 22 for currents $I_r$ induced by one of the quadrature fields produced by the RF coil 11. The resulting pattern includes numerous conductive loops encircling either of a pair of central conductive pads 23. These conductive loops will support eddy currents induced by the gradient fields unless they are open circuited. This is accomplished in the prior structure by making cuts indicated at 24 which extend from each conductive pad 23 to one edge of the copper sheet 20. While these cuts 24 stop eddy currents, they also impede the currents $I_r$, and reduce the effectiveness as an RF shield.

Figure 7:
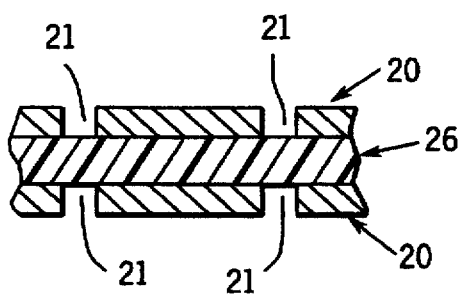
FIG. 7 is a partial view in cross section through a prior art RF shield.

The solution disclosed in U.S. Pat. No. 4,879,515 is to construct an identical structure by making the same cuts in a second sheet of copper 20 and forming the RF shield 10 by sandwiching a thin sheet of dielectric material 26 between the two copper sheets 20 as shown in FIG. 7. The conductive paths in each copper sheet 20 are aligned and form the plates of capacitors which offers low impedance connection of the respective conductive loops at the high RF frequencies, but not the lower frequencies of the changing gradient fields. Thus, the currents $I_r$ are allowed to flow in the copper sheets 20 to act as an RF shield, but the lower frequency eddy currents are blocked by the cuts 24.

It is a teaching of the present invention that the same pattern of conductive paths 22 can be used in an RF shield 10 comprised of two sheets of copper and one dielectric layer to block both of the quadrature fields produced by the RF coil 11. This is accomplished by aligning the pattern formed on one of the copper sheets with one of the quadrature fields, and aligning the patterns on the other copper sheet with the other quadrature field. Such orthogonal patterns are shown in FIGS. 5 and 6, where FIG. 5 illustrates the pattern on one sheet of copper 30 wrapped around the cylindrical RF coil 11, and FIG. 6 illustrates the location of the pattern on the other sheet of copper 31. As shown in FIG. 8, the copper sheets 30 and 31 are disposed on the opposite sides of a dielectric sheet 32, and since their patterns are not aligned, the contour cuts 21 therein do not align and the total capacitance between the sheets 30 and 31 is reduced. This reduction is offset, however, by decreasing the thickness of the dielectric sheet 32, which in the preferred embodiment is a polytetraflourethylene ("PTFE") fiberglass laminant manufactured by Allied Signal Corporation having a thickness of 0.0032"±0.003" and a dielectric constant of 2.57. The copper sheets 30 and 31 are formed from 2 oz copper having a thickness of 2.8 mils, and the contour cuts 21 that define the patterns therein have a width of approximately 20 mils.

It has been discovered that this single three-part shield effectively blocks the two quadrature RF fields produced by the quadrature RF coil 11 and prevents their interaction with the surrounding gradient coils 2. This is accomplished with a measured reduction in the SNR of less than 4% for the RF coil 11 when compared with the performance using a solid copper shield.

Eddy currents induced by the gradient fields are blocked by open circuiting each conductive loop in the patterns formed in the copper sheets 30 and 31. The pattern of cuts required to do this has been significantly altered to improve the RF performance of the shield. Referring to FIGS. 5 and 6, rather than extending a single cut from the center pads 34 to one edge, alternate conductive loops are open circuited by a series of short cuts 35 that extend along the entire circumferential (θ) extent of each copper sheet 30 and 31. This alternating of the cuts in the conductive rings distributes the short cuts 35 equally in both directions from the center pads 34 and balances the performance of the shield 11 for both quadrature RF fields.

Referring still to FIGS. 5–7, a number of measures are taken to eliminate the instances in which gradient induced voltage differences build up in the RF shield 11 and cause a breakdown producing noise. Such a breakdown can occur through the dielectric layer 32 between the sheets 30 and 31, or across contour cuts 21 on the same sheet 30 or 31. Excessive voltage between sheets 30 and 31 is prevented by shorting them together at three points indicated at 40, 41 and 42. This is accomplished by cutting slots through the dielectric layer 32, passing a conductive strap through each slot, and soldering the straps to each copper sheet 30 and 31. The shorting points 40, 41 and 42 are located at center pads 34 and they are located at the ends of conductive strips 44–47 which extend circumferentially through one-half of each conductive pattern. The shorting points 40, 41 and 42 join the conductive strips 44–47 together to form a continuous conductive ring that extends completely around the RF shield 11 at its center. However, this ring is open circuited at one point so as not to provide a path that will support eddy currents. Each conductive strip 44–47 short circuits all the conductive loops surrounding its associated center pad 34 so that excessive differential voltages cannot build up across the cuts 21 that form each conductive loop. Despite these shorting conductive strips 44–47 and examination of the pattern reveals that the alternated short cuts 35 still prevent a complete conductive loop from being formed and block gradient induced eddy currents.

To further reduce gradient induced eddy currents, the copper regions located at the corners of each conductive pattern are also interrupted by straight cuts indicated at 49. These straight cuts 49 are spaced apart to break up the conductive regions surrounding each pattern so that circular current paths capable of supporting eddy currents are not present.

We claim:

1. In a magnetic resonance system, the combination comprising:

an RF coil for producing a pair of RF fields in a bore which the RF coil surrounds, the pair of RF fields being oriented in quadrature with each other about a central axis passing through the bore;

a set of gradient coils disposed around the RF coil for producing a magnetic field gradient in the bore; and a shield disposed around the RF coil and located between the RF coil and the set of gradient coils, the shield including:

a) a dielectric sheet formed in a cylindrical shape and having an inner surface which faces the RF coil and an outer surface which faces the set of gradient coils;

b) a first conductive sheet disposed on the inner surface of the dielectric sheet and having contour cuts therein which divide it into a pattern comprised of conductive loops that align with currents induced in the shield by one of said RF fields; and c) a second conductive sheet disposed on the outer surface of the dielectric sheet and having contour cuts therein which divide it into a pattern comprised of conductive loops that align with currents induced in the shield by the other said RF fields;

wherein short cuts are made in each conductive loop to block the flow of eddy currents induced therein by the set of gradient coils.

2. In the magnetic resonance system as recited in claim 1 in which the pattern formed in the first conductive sheet is substantially the same as the pattern formed in the second conductive sheet, but the patterns are oriented in quadrature with each other about the central axis.

3. In the magnetic resonance system as recited in claim 1 in which each pattern includes a central pad around which the conductive loops extend and the short cuts are made in alternate ones of the surrounding conductive loops in a first path extending from the central pad in one direction around the central axis and the short cuts are made in alternate other ones of the surrounding conductive loops in a second path extending from the central pad in the other direction around the central axis.

4. In the magnetic resonance system as recited in claim 3 in which a conductive strip is formed in each pattern which connects the surrounding conductive loops together along and adjacent to one of the first or second paths.

5. In the magnetic resonance system of claim 4 in which the first and second conductive sheets are shorted together at a point in their respective patterns that link together their respective conductive strips.

6. In the magnetic resonance system of claim 5 in which the linked conductive strips form a conductive path completely around the central axis.

* * * * *